United States Patent [19]

Fischer

[11] 4,127,898
[45] Nov. 28, 1978

[54] STORAGE ELEMENT FOR AN ERASABLE, DIGITAL PERMANENT STORAGE

[75] Inventor: Dieter Fischer, Frankfurt am Main, Fed. Rep. of Germany

[73] Assignee: Battelle-Institute e.V., Frankfurt am Main, Fed. Rep. of Germany

[21] Appl. No.: 808,360

[22] Filed: Jun. 20, 1977

[30] Foreign Application Priority Data

Jun. 18, 1976 [DE] Fed. Rep. of Germany ....... 2627249

[51] Int. Cl.² ............................................. G11C 11/00
[52] U.S. Cl. ................................ 365/146; 307/88 ET
[58] Field of Search ................... 307/88 ET; 365/146; 340/324 M; 315/169 TV

[56] References Cited

U.S. PATENT DOCUMENTS

| 3,924,324 | 12/1975 | Kodera | 307/88 ET |
| 3,940,974 | 3/1976 | Taylor | 307/88 ET |
| 3,971,250 | 7/1976 | Taylor | 307/88 ET |
| 3,989,953 | 11/1976 | Fischer | 307/88 ET |

FOREIGN PATENT DOCUMENTS 2,529,699  1/1977  Fed. Rep. of Germany .......... 365/146

Primary Examiner—Bernard Konick
Assistant Examiner—Donald McElheny
Attorney, Agent, or Firm—Fisher, Christen & Sabol

[57] ABSTRACT

A storage element for an erasable, digital, permanent storage device is disclosed in which a bipolar, charged electret serves as the storage medium. The electret has a thin conductive layer on one side and a ring electrode on the other. The state of charge of the electret is changeable to erase, or change the storage element.

2 Claims, 10 Drawing Figures

STORAGE ELEMENT FOR AN ERASABLE, DIGITAL PERMANENT STORAGE

FIELD OF THE INVENTION

The invention relates to a storage element for an erasable, digital permanent storage, in which a bipolar, charged electret having the form of a foil or a thin layer serves as storge medium. A glow gap is on one side disposed, changes the ignition of which — depending on the polarity of the ignition voltage the state of charge of the electret.

BACKGROUND OF THE INVENTION

The proposal had already been made, to put a field — effect transistor in their film technique directly on the surface of the electret facing away from the glow gap, so that in case of ignition of the glow gap, the state of charge on the side of the electret facing the gas chamber of the glow gap, is changed. As a result of this, the electric field penetrating the semiconductor layer of the field effect transistor and thus the conductivity of this semiconductor layer is changed also (U.S. Pat. No. 3,989,953).

In this case however, triggering circuits, independent of one another are needed for the writing and reading of the information. Moreover, the application of the field effect transistors is expensive, so that the costs per bit are relatively high.

SUMMARY OF THE INVENTION

It is an object of the present invention, to overcome the described disadvantages and to create a storage element which is distinguished by as simple structure as possible, and by easy produceability. In order to be able to build a storage system from such storage elements, it is a further object that the write-in, reading, and erasing of the information be carried out with simple arrangements. High storage densities and short access times are also objectives of considerable importance.

It was found that these objectives may be accomplished with the storage element of the present invention in a surprisingly simple and technically progressive manner. According to the invention, the storage element consists of the initially described type, which however has an electrically conductive layer, evaporated on the surface of the electret facing away from the glow gap. A charge induced during change of the state of charge of the electret, or an already existing influence charge on the layer or the flowing off of this charge from said layer may be used as information concerning the state of the storage during ignition of the glow gap; the interrogation of the information is accomplished with the help of a read-out-writing impulse.

According to an advantageous embodiment of the invention, the storage element is built up symmetrically and has two oppositely polarized electrets disposed in parallel, between which the glow gap is inserted. The distance between the parallel electrets corresponds to the length of the glow gap. The conductive layers are on the surface of the electrets facing away from the glow gap and always one ring electrode is evaporated on the surface facing the gas chamber of the glow path. In this case, the two ring electrodes are connected with earth potential, and then the storage element is triggered earth-symmetrically via the two conductive layers.

In an other embodiment of the invention, the individual storage element merely contains one electret, on one surface of which the conductive layer and on the opposite surface of which, facing the gas chamber of the glow gap, a ring electrode has been evaporated on.

The storage element of the invention thus has an extremely simple structure. It is suitable for the construction of a so-called "random-access" permanent storage, in case of which an extensive electret foil or thin electret layer, common to many storage elements serves as a storage medium. The writing, reading and erasing takes place by microplasma discharges with the help of the glow gap, present in every storage element. At the same time charges are applied or neutralized on one of the surfaces of the electret foil or electret layer and as a result charges are influenced or released in the conductive layer, which is evaporated on the opposite surface of the electret. The read-out of the information is accomplished dynamically with the help of reading-writing impulses, known per se.

In case of triggering of a "random-access" permanent storage built up with the storage elements of the invention, by way of selector matrixes, only relatively few external connections are needed. The times needed for writing, reading and erasing, especially also access times, are — (in case of use of storage elements according to the type of the invention) — about 1 $\mu s$. The storage density depends on the possibilities of the thin-film technique and is about $10^4$ to $10^5$ bit/cm$^2$. Since the entire storage element, i.e., one or two electret foils with conductive layers evaporated on and with the pertinent glow gap, may be made relatively thin, storage densities of $10^6$ bit/cm$^3$ may be achieved by stacking (in case of plate thicknesses of about 0.5 to 1mm).

Additional characteristics, advantages and possibilities of application of the invention will result from the following illustration of additional details, the description of the physical processes and the cooperation with other similar storage element on the basis of the attached figures.

DETAILED DESCRIPTION OF THE PREFERRED EMBODIMENTS

A more detailed explanation of the characteristics of electrets used here, is to be found in German Pat. No. 2,440,907.

Figure 1:
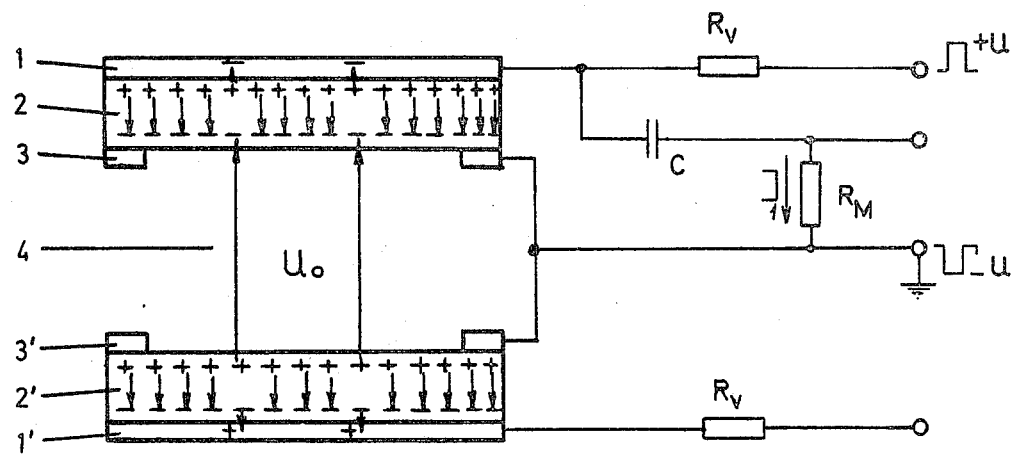
FIG. 1 is a schematic diagram, according to one embodiment of the invention, of a symmetrically built storage element in its starting state.

The storage element illustrated in FIG. 1, of the invention represents a special embodiment of the invention insofar as it is an earth symmetrically triggerable storage element. In this example it consists essentially of two electret foils 2 and 2' of about 5 to 10 μm thickness, which are disposed coplanar in relation to each other at a distance of about 50 μm. On their surfaces facing each other, the two foils each carry a ring electrode 3, 3' and on their surfaces facing away from one another they always carry a full electrode, which is realized here by a thin, electrically conductive layer 1, 1', which is evaporated on.

The two ring electrodes 3, 3' are connected with earth potential while the electrodes 1, 1' are triggered earth symmetrically. The space between the two symmetrical arrangements 1,2,3-1',2', 3' is occupied by a glow gap 4, the length of which corresponds to the distance between the two electrets 2, 2'.

In the starting stage of the storage element of FIG. 1, the field of the electret charge is almost completely closed in the inside of the electret foils 2 or 2', there is a slight field between the two foils, which leads to the following voltage:

$$U_o = \frac{\sigma_o}{\epsilon_o} \frac{d_E \cdot a}{2d_E + \epsilon \cdot a}$$

In this formula $\sigma_o$ = charge density on the foils (equally large in both)

$d_E$ = thickness of the electret foils, $a$ = distance between the foils.

By suitable selection of the parameters in the above formula and of the type of gas and of the gas pressure the two electret foils 2 and 2' its ignition voltage $U_z$ and $U_o$ are precisely defined. In order to avoid any automatic discharge $U_o < U_z$.

Figure 2:
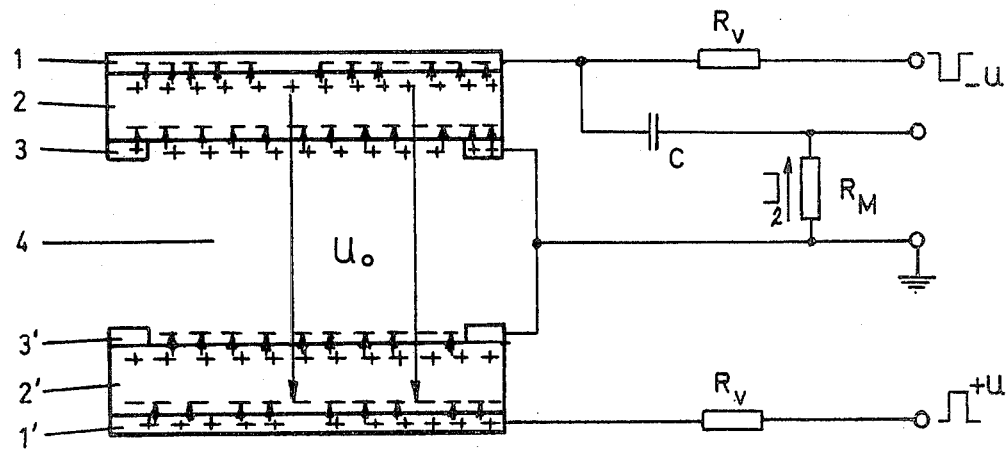
FIG. 2 is a schematic diagram of the storage element as in FIG. 1 after recording of an information.

By applying a voltage impulse U between the electrodes 1 and 1' of the symmetrical storage element of FIG. 1, the glow gap is ignited; the voltage U at the same time must be rectified to voltage $U_o$. As a result of that the charges applied to the gas chamber, are compensated on the electret foils 2, 2', as indicated in FIG. 2. Because of the compensation, a counter voltage $U_o'$ develops because of the reversed polarity, as a result of the electret charges facing away from the gas chamber of the glow gap, so that the gas discharge breaks down, even in case of a still connected outside voltage, after about 200 ns.

The counter voltage $U_o$ is about equally as great as the original voltage but it has reverse polarity. By applying additional voltage impulses with the polarity of the voltage U, this state may not longer be changed, i.e., it is permanent and represents the recorded information.

Figure 3A:
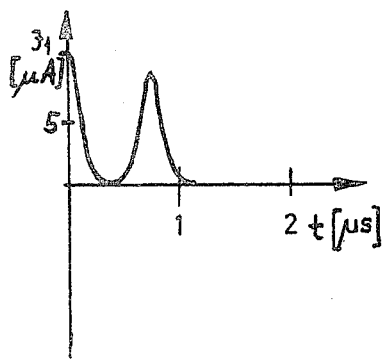
FIGS. 3a, 3b, are graphs showing the temporal course of the ignition current in case of writing and erasing of the information.
Figure 3B:
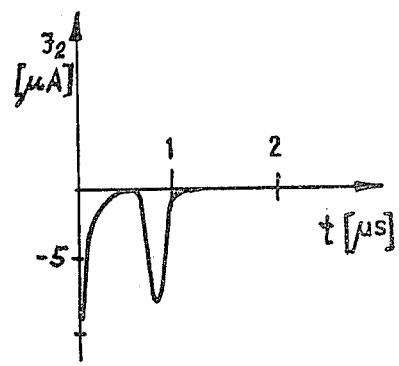

By applying a voltage impulse with reverse polarity, i.e., with a voltage, which is rectified to $U_o'$ an ignition of the glow gap 4 again takes place, which leads to the reestablishment of the starting state and thus causes an erasure of the information. The current flowing during the erasure causes a voltage drop on the resistor $R_v$, cf. FIG. 1 or FIG. 2, which leads via the capacitor C on the resistor $R_M$ to a signal, which may there be used for the detection of the information i.e., reading of the information. Whenever the information in the storage element is merely to be interrogated, but is to be maintained further, then it is immediately recorded again by an impulse, which is rectified with $U_o$ this is called "dynamic reading". FIGS. 3a,b show the course of the ignition current in case of writing (FIG. 3a) and or erasing (FIG. 3b).

Figure 4:
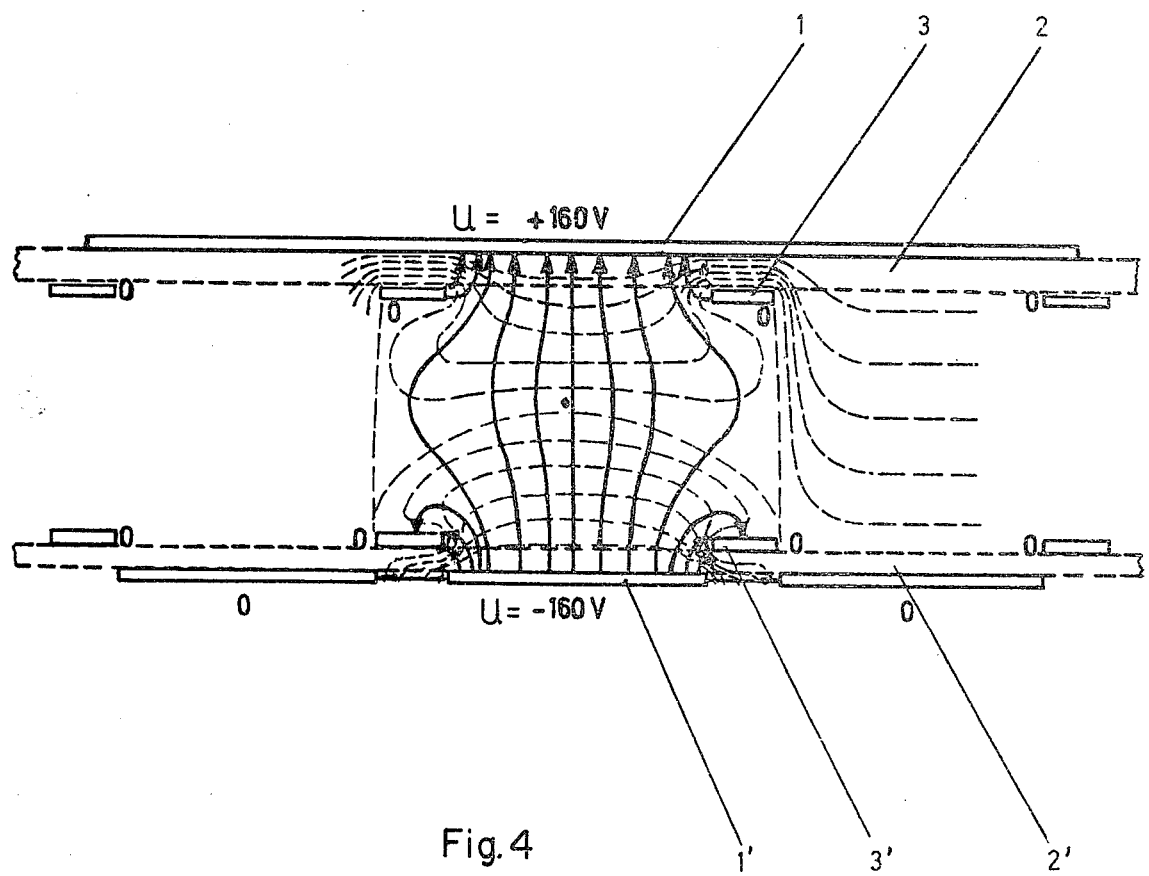
FIG. 4 is a diagram of the course of the electric field in the storage element as in FIG. 1.

During construction of a storage one strives basically for as high as possible number of storage elements per unit area. The triggering in the present case, consists of a matrix arrangement of the individual elements of the invention, whereby the conductive layers or electrodes 1, 1' are constructed as conductor paths running perpendicularly to one another. The triggered storage element is located at the point of crossing of two conductor paths. The voltage is applied earth symmetrically to these conductor paths, while all other conductor paths are connected to earth potential. As a result, an electric field occurs in the gas chamber of the glow gap assigned to the individual storage element. This field would overlap to the adjacent elements and in case of a higher density of elements it would lead to undesirable cross talk, unless, according to the present invention the electrode facing the gas chamber of the glow gap is developed as a ring electrode 3 or 3', which is connected to earth potential. As FIG. 4 illustrates, the border field is intercepted by these annular electrodes, so that even the gas discharge within the triggered storage element remains localized. Even, without walls between the individual gas chambers of the individual elements, a cross talk will be prevented thereby even in case of a high element density.

Figure 5:
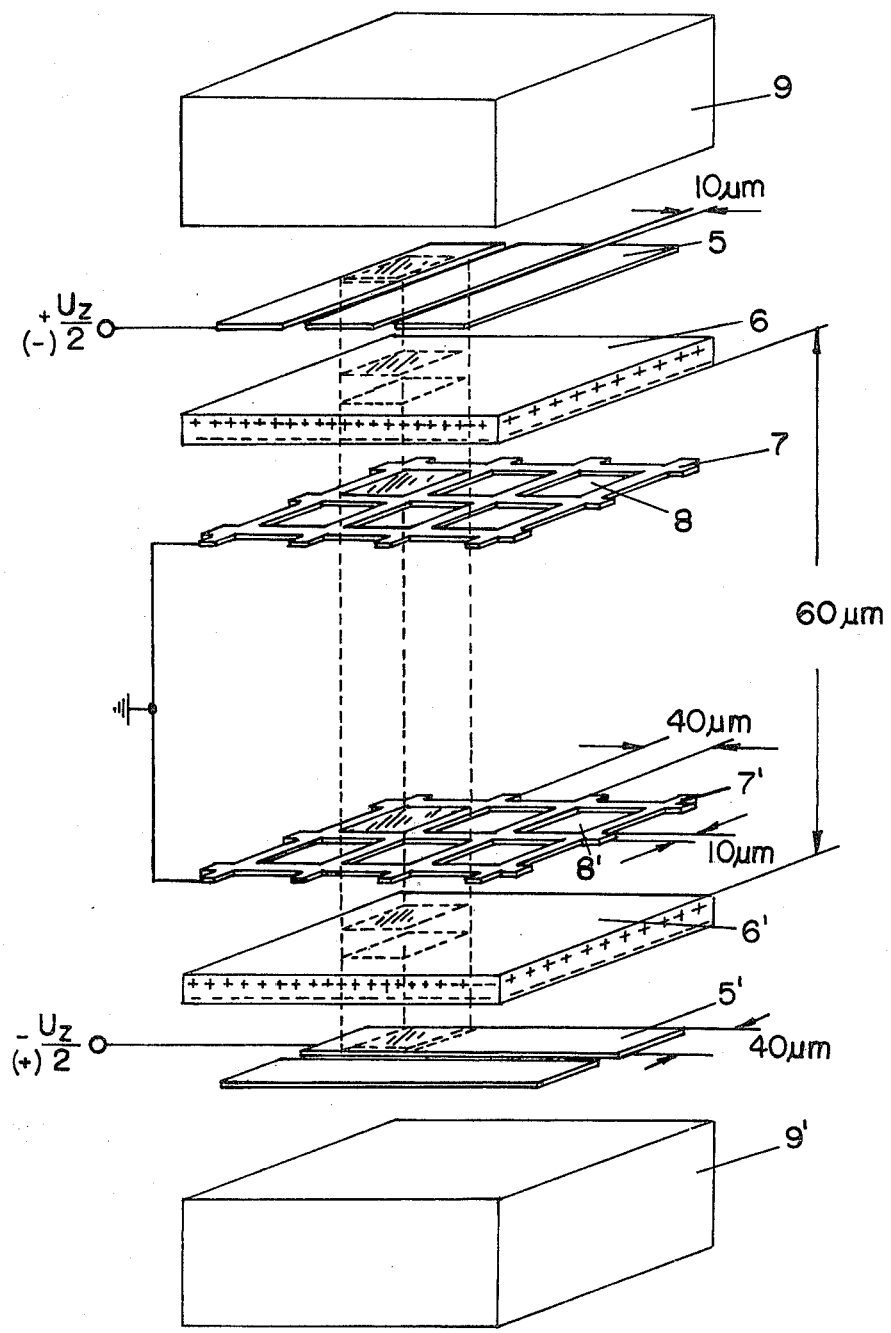
FIG. 5 is an exploded, perspective view structure composed of of a storage from several storage elements as in FIG. 1.

The construction of a complete storage from the storage elements of the invention may be realized according to the principle shown in FIG. 5. According to this, a matrix arrangement of the individual storage elements with x-y triggering has been provided. The most essential components of the storage are for one the arrangement of the storage cells and for another the integrated triggering electronics.

FIG. 5 serves for the explanation of the arrangement of the individual storage cells for a dynamic storage. The dimensions provided according to an embodiment of the invention are likewise entered.

The structure of the storage of FIG. 5 is symmetrical. Two glass/or ceramic lamellae 9, 9' serve as carriers, on which first two parallel conductor paths 5, 5' of aluminum and the subsequently explained triggering electronics, not shown in FIG. 5, are evaporated. Over these conductive layers, here developed as conductor paths 5, 5', and which correspond to the layers 1, 1' of FIGS. 1 and 2, a 6 μm thick adhesive foil 6, 6', in this case an FEP foil, provided with a thin silicon adhesive film, in glued; on that an aluminum grid 7, 7' is evaporated in such a way that the loops of the grid 8, 8' will be opposite the conductor pats 5, 5'.

The charging (formation) of the electret foils is accomplished here with the help of the liquid contact process. For this a film of liquid is produced using a small sponge saturated with distilled water or methanol on the surface of the electret foil, on which the aluminum grid 7, 7' forming the ring electrodes has been evaporated on. Between this film and the electrodes 7, 7' surrounded via the triggering electronics, a voltage of about 600 V corresponding to the intensity of the field of $10^6$v/cm is applied for about 1 min; the blocking resistances of the transistors of the triggering electronics at the same time act practically as a short circuit vis a vis the extremely high resistance of the electret foil.

The mounting of the storage according to FIG. 5 takes place with the help of a spacing piece, not shown, between the two carrier lamellae 9, 9', with the applied electrodes and electret foiles.

Figure 6:
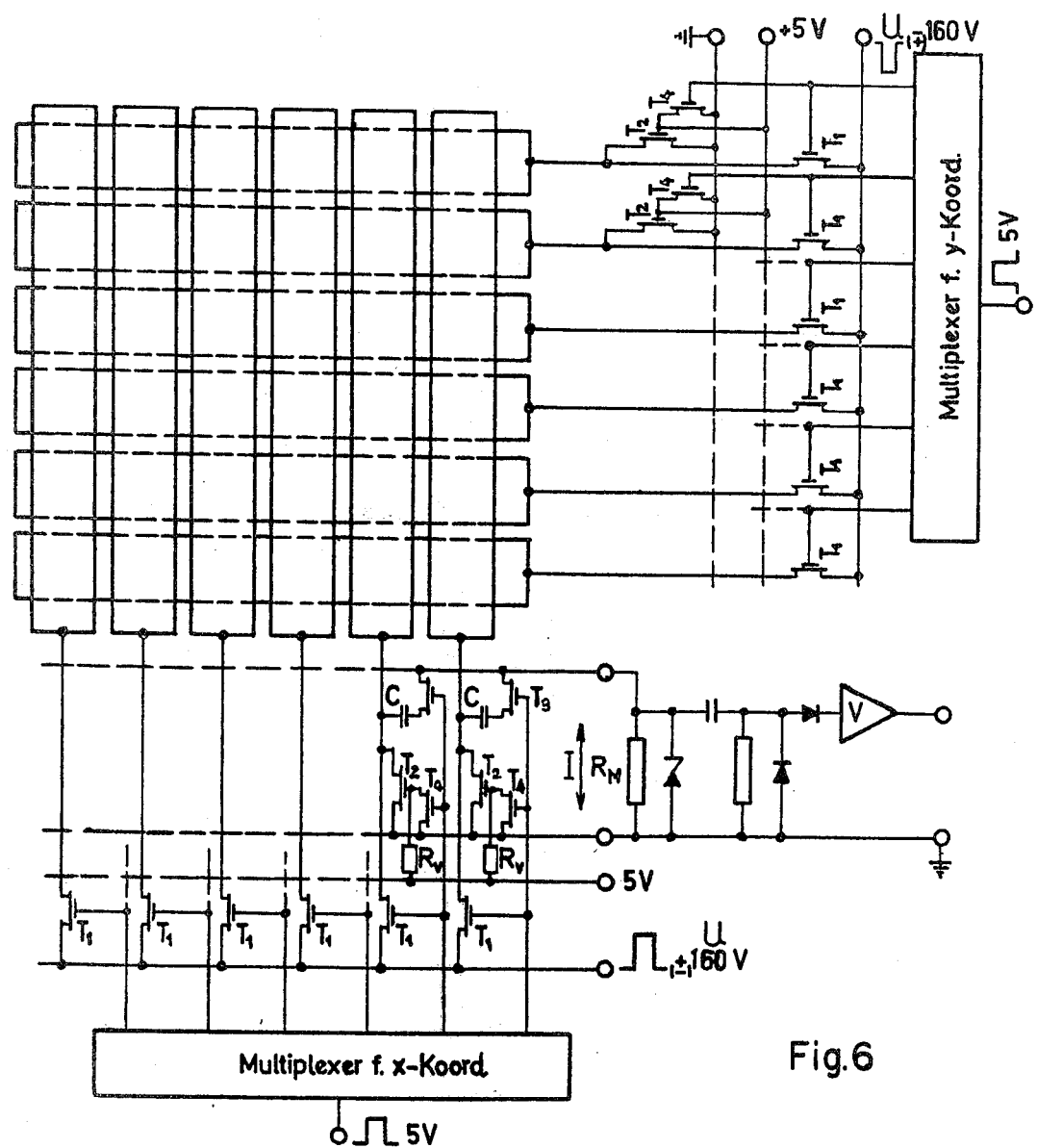
FIG. 6 is a schematic diagram of the modulation eletronics of a dynamic storage, consisting of elements as FIG. 1.

As FIG. 6 illustrates, in the embodiment of the invention described in the following, the triggering electronics is realized with the help of CdSe .-thin layer transistors $T_1$-$T_4$, with which voltages up to 200v may be switched in less than $10^{-7}$ (T. P. Brody et al., IEEE Trans. Electron. Rev., ED22, 10, p. 739; 1975). The transistors $T_{1x}$ and $T_{1y}$, which are triggered with the help of a multiplexer or of a matrix, take over the connecting of the x or y strips on the intersection of which is the selected storage element of the type of the invention. As a result, the full voltage is applied to this storage element, which makes possible an ignition of the glow gap, in case of the corresponding state of charge of the electret foil at this spot or in this element.

In order to avoid a slow charging of the not triggered conductor paths via the blocking resistances of the transistors T, leakage resistances are needed which in FIG. 6, are constructed as switches from the transistors $T_2$ and $T_4$. The gates of the transistors $T_2$ are continuously connected with 5v, so that these transistors in their state of rest are of low resistance (impedance) and act as leakage resistances. As soon however, as the corresponding conductor path is triggered, a 5v pulse appears at the gate of $T_4$, in case of this being connected through into the low resistance state, the voltage at the gate of the transistor $T_2$ collapses because of the resistor $R_\nu$, so that $T_2$ becomes highly resistive. With that, almost the full voltage appears at the triggered conductor paths, whereas the not triggered conductor paths are kept practically at ground (mass) potential.

Figure 7:
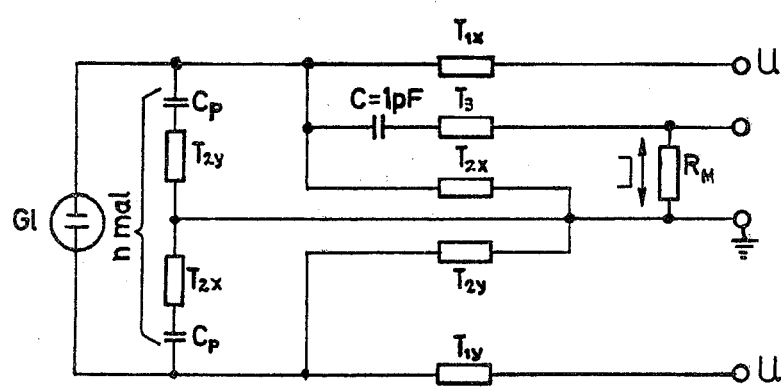
FIG. 7 is a schematic replacement circuit diagram for the modulation of a single storage element of the type of constrution of FIG. 1.

The measurement of the current flowing during the ignition of the glow gap of a storage element is accomplished with the help of a circuit, the equivalent diagram of which is shown in FIG. 7. The transistors $T_1$, $T_2$, and $T_3$ are shown as resistors for the sake of clarity. The element $G_1$ symbolizes the discharge gap of the glow gap, the capacitances of which lies at $10^{-15}$F. The capacities Cp are formed at the crossing points of the triggered with the not triggered conductor paths. Their value likewise lies at $10^{-15}$F. Whenever the discharge gap G1 is triggered, then the transistors $T_1$ and $T_3$ are connected through therefore of low impedance, while $T_2$ is locked and thus of high impedance. The in-out resistance ratio of these transistors lies at about 1:1000. The back resistance amounts to about 10MΩ the forward resistance to about 10kΩ.

Thus the RC time constants are small vis-a-vis the switching times of the transistors. These switching times however are again small as compared to the ignition delay time of about 0.5 μs, so that the charge current after this time has dropped practically to zero. In case of ignition of the glow gap G1, a voltage drop occurs on $T_{1x}$, which may be measured via $C_1$ and $T_3$ on $R_M$ in a differentiated form. The strength of the current flowing during the ignition of the glow gap results at an area of the storage element of 40 μm × 40 μm = 1.6 · $10^{-5}$cm$^2$, a charge density of $10^{-7}$ Ac/cm$^2$ and a recharging time of about 500ns to 3 μA as an average value, so that one might count with a peak current of about 5 μA, which at $T_{1x}$ = 10kΩ, produces a voltage change of 50m V and at $R_M$ = 100kΩ is transferred at about one half to this measuring resistance.

However, a small part of the reverse current of the not triggered transistors $T_1$ of about 5nA flows through $R_M$. In case of a storage of 1000 × 1000 individual storage elements this reverse current amounts to about 5 μA and is thus about as great as the ignition current. Since the reverse current decays with a time constant of a few $10^{-}$s, it acts like a d.c. current component as compared to the quick change of the ignition current and may easily be separated from the ignition current signal.

With such a triggering circuit, a perfect operation of the dynamic storage will thus be possible.

For the construction of a storage with 1024 × 1024 elements and in case of use of 10-bit addresses, 2 × 10 lines will be needed for the triggering of the selected storage element, furthermore two ignition voltage lines, one 5V line, one mass-line and one measuring line, so that altogether 25 supply lines are needed. The area of this storage is with triggering eletronics, 6 × 6cm. In case of parallel connection of several individual storages in z - direction, a similar organization as in the case of a core memory is possible. For this, each of the carrier lamellae 9 or 9' is used on both sides according to FIG. 5. The supply lines are soldered into tinned notches at the edge of each lamella, as a result of which the fixation of the individual planes against each other takes place simultaneously.

The storage built up in this way is inserted into a gas-tight housing, which is filled with the inert gas (noble gas) needed for the gas discharges of the glow gap.

A somewhat diverging, but in principal equal embodiment of the storage results, whenever the glass and ceramics lamellae 9, 9' according to FIG. 5 and provided as carriers, are replaced by silicon single crystal slices. Here, the triggering circuit may then be integrated in the known technique.

Diverging from the described symmetrically builtup storage element according to FIGS. 1, 2, 4 and 5, a simplified construction may also be used as storage element. According to the type of embodiment shown in FIGS. 8 and 9, the storage element consists so to speak of one half of the described symmetrical element. Here too, the electret is again developed as thin layer or foil 10, cf. FIGS. 8 or 9, on one surface of which it is the surface facing the glow gap (not shown in FIGS. 8, 9) — a ring electrode 11 is again evaporated on. On the opposite side is the electrically conductive layer 12, likewise evaporated on.

Figure 8:
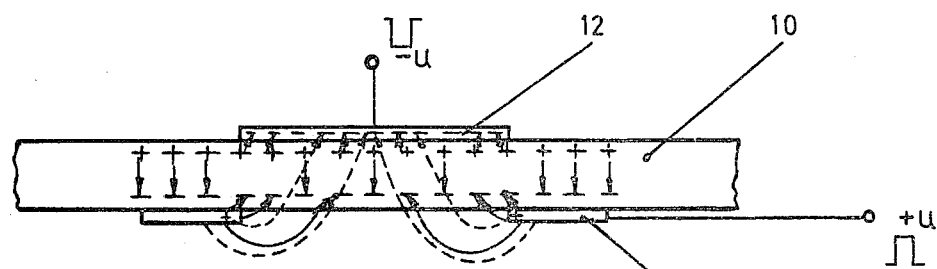
FIG. 8 is a diagram of an alternative embodiment of the storage according to the invention, with the course of the lines of force in the starting position.
Figure 9:
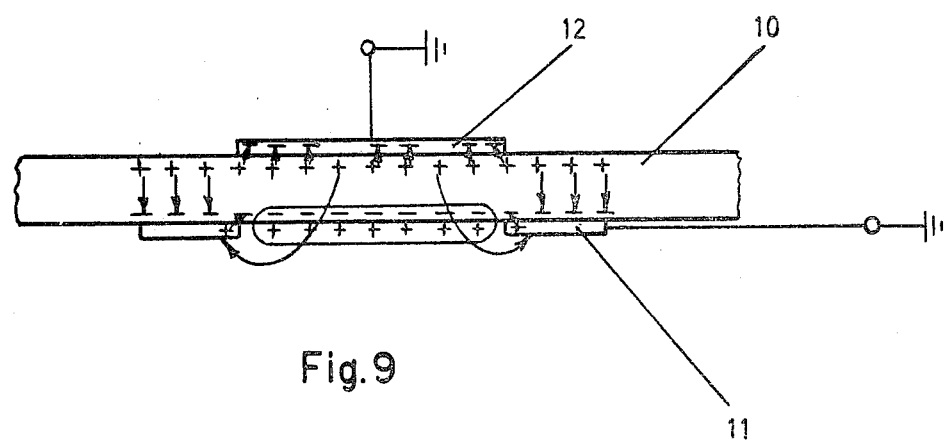
FIG. 9 is a diagram of the storage element of FIG. 8 with the course of the lines of force after recording of the information.

In the starting state of the storage element of FIG. 8, the field pattern, indicated there, prevails. The field running (passing) through the gas chamber (following downwards) of the glow gap does not suffice in order to ignite a discharge. But whenever a voltage of about ±150V is applied between the electrodes 11 and 12 in such a way, that the field created thereby (it has been indicated by a broken line in FIG. 8) is added to the existing field, then an ignition (firing) takes place. The latter leads to a neutralization of the electret charge facing the gas chamber, so that now only the charge facing away from the gas chamber becomes effective. Since this charge has an inverted polarization, opposing field develops which leads to the break-off of the charge. This condition is again permanent and it here represents the storage information. FIG. 9 shows the field pattern in this case.

By applying a voltage pulse with inverted polarity as above, it will be possible to achieve a new ignition, as a result of which the starting state according to FIG. 8 will again be reached; This therefore means an erasure of the information. The current flowing during the erasure indicates that the element had stored information from which the desired signal may be derived during reading of the information. If the information is to be preserved it will immediately be recorded again.

I claim:

1. A storage element for an erasable, digital permanent memory wherein a bipolar charged electret, in the form of a foil or a thin layer serves as a storage medium and wherein a glow gap is disposed on one side of said electret, the ignition of which changes the state of charging of the electret, comprising:

(a) a pair of electret foils disposed in parallel defining a glow gap therebetween, each electret foil having a thin, electrically conductive layer evaporated onto the surface facing away from the glow gap and a ring electrode evaporated onto the surface facing the glow gap, said ring electrodes being connected to earth potential;

(b) means to charge said electrets with opposite polarity causing a bias voltage in the glow gap whereby a permanent state of charge exists; and (c) means to apply a voltage pulse balanced to ground to said conductive layers, said voltage pulse being equidirectional to the polarity of the bias voltage causing a gas discharge in said glow gap which causes a change in the charge of said electrets facing the glow gap and induces a bias voltage as before, but with opposite polarity thereby establishing a new permanent state of charge such that the discharge current during firing of the glow gap may be used as a source of information concerning the state of the storage.

2. A storage element for an erasable, digital permanent memory wherein a bipolar charged electret, in the form of a foil or a thin layer, serves as a storage medium, comprising an electret foil having a thin, electrically conducting layer evaporated onto one surface and a ring electrode evaporated onto an opposite surface; means to charge said electret causing a bias voltage between the ring electrode and the conductive layer; and means to apply a voltage pulse balanced to ground to the conductive layer and to the ring electode.

* * * * *